United States Patent
Longobardi et al.

(10) Patent No.: US 8,676,397 B2
(45) Date of Patent: Mar. 18, 2014

(54) REGULATING THE TEMPERATURE OF A DATACENTER

(75) Inventors: Giuseppe Longobardi, Castellammare di Stabia (IT); Scot MacLellan, Rome (IT); Giulio Santoli, Rome (IT)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 13/274,455

(22) Filed: Oct. 17, 2011

(65) Prior Publication Data

US 2012/0158206 A1   Jun. 21, 2012

(30) Foreign Application Priority Data

Dec. 20, 2010   (EP) ..................................... 10195840

(51) Int. Cl.
*G01M 1/38* (2006.01)
*G05B 13/00* (2006.01)
*G05D 23/00* (2006.01)
*A47J 39/00* (2006.01)
*F25B 29/00* (2006.01)
*F24F 11/06* (2006.01)

(52) U.S. Cl.
USPC ........... 700/299; 700/276; 700/277; 700/300; 165/201; 165/247

(58) Field of Classification Search
USPC ........... 700/276–277, 299–300; 165/201, 247
See application file for complete search history.

(56) References Cited

U.S. PATENT DOCUMENTS

| | | | |
|---|---|---|---|
| 5,318,224 A | 6/1994 | Darby et al. | |
| 6,574,104 B2* | 6/2003 | Patel et al. | 361/695 |
| 6,718,277 B2* | 4/2004 | Sharma | 702/132 |
| 6,977,587 B2* | 12/2005 | Pradhan et al. | 340/539.26 |
| 6,983,210 B2* | 1/2006 | Matsubayashi et al. | 702/60 |
| 7,114,555 B2* | 10/2006 | Patel et al. | 165/247 |
| 7,373,268 B1 | 5/2008 | Viredaz et al. | |
| 7,484,111 B2 | 1/2009 | Fung | |
| 7,493,193 B2 | 2/2009 | Hyland et al. | |

(Continued)

FOREIGN PATENT DOCUMENTS

EP   1306735 A1   5/2003

OTHER PUBLICATIONS

EnOcean, [online]; [retrieved on Oct. 6, 2011]; retrieved from the Internet www.enocean.com Enabled by EnOcean, "Perpetuum: Maintenance-Free Wireless Switches and Sensors," Perpetuum—vol. 4, Issue 6, International Edition; Oct. 2007-Mar. 2008.

(Continued)

*Primary Examiner* — Ronald Hartman, Jr.
(74) *Attorney, Agent, or Firm* — Cantor Colburn LLP; Terry Carroll

(57) ABSTRACT

A method for regulating the temperature of a datacenter within an optimum temperature range includes predicting, using a computing device, a thermal load from a workload scheduler containing information on machines assembled in the datacenter to be turned on and/or off during a particular time period, and the thermal load of the datacenter associated with the work of the machines within the particular time period; and controlling at least one cooling system of the datacenter based upon the predicted thermal load within the particular time period under consideration of the thermal inertia of the datacenter by at least one of activating, controlling, and deactivating cooling resources of the cooling system in advance to maintain the temperature of the datacenter within the optimum temperature range.

14 Claims, 3 Drawing Sheets

(56) References Cited

U.S. PATENT DOCUMENTS

| | | | |
|---|---|---|---|
| 8,140,652 B2* | 3/2012 | Calo et al. | 709/221 |
| 8,155,793 B2* | 4/2012 | Nakajima et al. | 700/277 |
| 8,346,398 B2* | 1/2013 | Ahmed et al. | 700/278 |
| 8,473,108 B2* | 6/2013 | Mizuno et al. | 700/277 |
| 2004/0109288 A1* | 6/2004 | Beitelmal et al. | 361/687 |
| 2005/0273208 A1 | 12/2005 | Yazawa et al. | |
| 2006/0259621 A1* | 11/2006 | Ranganathan et al. | 709/226 |
| 2007/0062685 A1 | 3/2007 | Patel et al. | |
| 2009/0132097 A1 | 5/2009 | Sharma et al. | |
| 2010/0211810 A1* | 8/2010 | Zacho | 713/324 |
| 2010/0241881 A1* | 9/2010 | Barsness et al. | 713/320 |
| 2011/0016342 A1* | 1/2011 | Rowan et al. | 713/340 |
| 2012/0116595 A1* | 5/2012 | Mizuno et al. | 700/277 |
| 2012/0232877 A1* | 9/2012 | Bhagwat et al. | 703/13 |
| 2013/0235519 A1* | 9/2013 | Miyauchi | 361/679.46 |

OTHER PUBLICATIONS

Cyryl Krzyska, "Smart House Simulation Tool," Informatics and Mathematical Modelling (IMM); Technical University of Denmark; pp. 1-55; 2006.

* cited by examiner

REGULATING THE TEMPERATURE OF A DATACENTER

PRIORITY

This application claims priority to European Patent Application No. 10195840.3, filed 20 Dec. 2010, and all the benefits accruing therefrom under 35 U.S.C. §119, the contents of which in its entirety are herein incorporated by reference.

BACKGROUND

The present invention relates to a method as well as a system for regulating the temperature in a datacenter. More particularly, the invention relates to a method and a system for regulating the temperature of a datacenter within an optimum temperature range based upon the thermal load predicted for the datacenter from a workload scheduler.

Electrical power consumption is one of the major expenses in maintaining datacenter locations. One source of power consumption is the need to cool of the datacenter. The machines assembled in the datacenter produce a great amount of lost heat that has to be conducted from the machines to ensure the optimum working conditions for the datacenter and to avoid damages. The power requirement to conduct the lost heat of a single machine is in the order of about 10% of the overall power consumption of the machine, while the power requirement to conduct the lost heat of an assembly of machines in a datacenter can be in the order of about 50% of the overall power consumption of the datacenter. However, it is a common and recognized need to reduce power consumption.

In the datacenter some parameters like humidity and temperature are critical for the machines assembled in the datacenter. Normally, there are devices like a thermostat that monitor the temperature and take the proper actions to switch on the cooling devices when the temperature excites a certain threshold. The optimum is to keep the temperature constant, within a small range around the optimal temperature. The cooling systems of the datacenter have to face some initial inertia to change the temperature. In a pool of machines, such workstations, tape units, printers, and string of disks, for example, if all components are activated at the same time, this will result in a temperature peak. In turn, the cooling system will react more lethargically in trying to reach the optimal temperature range again. The opposite problem occurs when a pool of machines is turned off. The cooling system will be turned off when the temperature in the datacenter falls below the threshold temperature. However, the cooling system will continue to have an effect on the room temperature due to the thermal inertia of the datacenter. A negative temperature peak below the threshold limit will be the result. This means that more heat is conducted as needed.

Furthermore, to avoid peak temperature that may harm the machines in the datacenter, the threshold limit is set to a value significantly below a critical temperature. This also results in the fact that more heat is conducted as needed, too.

US 2005/0273208 A1 discloses an electronic device cooling apparatus and a method for cooling electronic device with temperature prediction. The control unit of the apparatus disclosed may decrease a target value of temperature control of the cooling unit for cooling when a rise in temperature is predicted. The control unit may increase the target value of temperature control of the cooling unit for cooling when a drop in temperature is predicted. The target value can be adjusted to control a difference between the current temperature and the target value. The operation level of the cooling unit which is controlled in accordance with the difference can thus be controlled in advance. Another aspect of US 2005/0273208 A1 is an electronic device system. This system comprises: an electronic device; at least one cooling unit which cools the electronic device; a predicting unit which predicts a temperature of the electronic device from an operating load; and a control unit which controls the cooling unit based upon the predicted temperature.

U.S. Pat. No. 7,493,193 discloses a method for monitoring and real-time heat load control based upon server and environmental parameters. Here it is disclosed that, as the number of jobs increase, which increases processor utilization, the power consumption rises to the point where the air inlet temperature is out of the manufacturer's specification for a short duration. In response to the temperature rise, the equipment fans change speed to bring more chilled air into the equipment, thus reducing the temperature measured at the air inlet. Because the air inlet temperature rises to a very high level, this may have an impact on reliability and uptime.

U.S. Pat. No. 7,373,268 relates to a method and a system for dynamically controlling cooling resources in a datacenter. Disclosed in the '268 patent is a method and system for dynamically controlling cooling resources in a datacenter based upon the workload of the datacenter. Accordingly, based upon the workload constraints (power consumed, latency, etc.) of the datacenter, each of a plurality of different types of cooling resources is activated in an optimal fashion. Consequently, a substantial savings in operational costs related to cooling resources is achieved. A first aspect is a method for dynamically controlling cooling resources in a datacenter. The method comprises determining a workload within the datacenter, determining an amount of heat being generated as a function of the workload and activating each of a plurality of different types of cooling resources within the datacenter in an optimal fashion based upon the amount of heat being generated.

U.S. Pat. No. 7,484,111 relates to a system and method for power on demand and workload management. The system described may also be structured such that the threshold or thresholds are set or adjusted dynamically. Dynamic thresholding may, for example, be based at least in part on present, past, and/or predicted future loading, quality of service indicators or factors, or other measures or parameters. Furthermore, while a simple utilization threshold has been described, more elaborate control may be implemented. For example, in addition to the threshold, a velocity measure of the time rate of change of utilization may be utilized as well. This may then result in a dynamically determined threshold that depends upon how fast the utilization is changing and its direction. A system is described, wherein the predicted decrease in server load is a prediction based at least in part on time of day. Furthermore, a system is described wherein a plurality of cooling fans are provided and operate under control of the power manager that controls each fan to provide cooling at the rate and location desired to maintain the computers within a predetermined temperature range. In an embodiment, a plurality of computers is disposed within a common enclosure and the system further comprising a plurality of temperature sensors and a plurality of cooling devices are also disposed within the enclosure, the plurality of temperature sensors communicating a temperature signal to a temperature control means and the control means adjusting the on/off status and operational parameters of the cooling units to extract heat according to predetermined rules.

US 2009/0132097 A1 discloses a virtual cooling infrastructure. Here, a virtual cooling infrastructure includes a demand manager having logical descriptions of a plurality of heat loads and the demand manager is configured to determine cooling load demands of the heat loads. The infrastructure also includes a capacity manager having logical descriptions of a plurality of cooling system components configured to supply cooling resources to cool the heat loads. The infrastructure further includes a service operator configured to map the cooling resources of the cooling system components to the cooling load demands of the heat loads. The demand manager estimates the cooling load required by the heat loads and the capacity manager allocates cooling resources to the heat loads based upon the available capacities of the cooling system components, while remaining within the capacity limitations of the cooling system components. In addition, or alternatively, the capacity manager allocates cooling resources first and the demand manager allocates heat loads based upon the allocated cooling resources. In any regard, the service operator is configured to monitor the heat loads and the cooling resource provisioning to substantially ensure that various policies are being met.

In US 2006/0259621 A1 a historical data based workload allocation is disclosed. Here, an input source may input the workload request in the form of the workload to be performed and a prediction of resource utilization in performing the requested workload, collectively referred to as the requested workload profile. Input of the requested workload profile may include, for instance, information pertaining to the number of servers required to perform the workload, the amount of time the servers will be required to operate to perform the workload, etc. Input of the prediction of resource utilization may include information pertaining to a prediction of one or more of the CPU utilization, the memory utilization, the network utilization, and the storage utilization associated with the requested workload. In addition, input of the requested workload profile may include information related to a prediction of power consumed by the datacenter in performing the requested workload. The information pertaining to the power consumption prediction may alternatively comprise information pertaining to a prediction of the amount of power consumed by the units in maintaining a server within predetermined temperature ranges. The information pertaining to the predicted resource utilization may be generated based upon knowledge of the types of workload requested and past resource utilization. In this regard, an algorithm that determines the types of workload requested and the past resource utilizations corresponding to those types of workload requests may be employed to generate the predicted resource utilization.

US 2007/0062685 A1 relates to a device and method for controlled cooling of a datacenter. The disclosed method comprises, separately controlling a cooling apparatus and a fluid supply apparatus of a device, wherein the cooling apparatus is configured to vary a temperature of a cooling fluid and wherein the fluid supply apparatus is configured to vary a volume flow rate of the cooling fluid supplied by the device.

SUMMARY

A method for regulating the temperature of a datacenter within an optimum temperature range includes predicting, using a computing device, a thermal load from a workload scheduler containing information on machines assembled in the datacenter to be turned on and/or off during a particular time period, and the thermal load of the datacenter associated with the work of the machines within the particular time period; and controlling at least one cooling system of the datacenter based upon the predicted thermal load within the particular time period under consideration of the thermal inertia of the datacenter by at least one of activating, controlling, and deactivating cooling resources of the cooling system in advance to maintain the temperature of the datacenter within the optimum temperature range.

In another embodiment, a system for regulating the temperature of a datacenter within an optimum temperature range by at least one cooling device includes a main controller; a control interface that receives data entered by a user; a scheduler application; a workload schedule database; and workload based logic; wherein the control interface is adapted to receive input, from the user, including a thermal threshold value for a datacenter temperature into a main controller, and wherein the main controller is adapted to control at least one cooling device of the datacenter based upon the inputted threshold value and a predicted thermal load calculated by the workload based logic, the workload based logic adapted to predict a thermal load of the datacenter based upon information in a schedule plan database, the schedule plan database logically connected to a scheduler application interface that delivers information to the schedule plan database about scheduled jobs to be performed by machines assembled in the datacenter.

In still another embodiment, a non-transitory, computer readable medium having computer readable instructions stored thereon that, when executed by a computer, implemented a method for regulating the temperature of a datacenter within an optimum temperature range. The method includes predicting a thermal load from a workload scheduler containing information on machines assembled in the datacenter to be turned on and/or off during a particular time period, and the thermal load of the datacenter associated with the work of the machines within the particular time period; and controlling at least one cooling system of the datacenter based upon the predicted thermal load within the particular time period under consideration of the thermal inertia of the datacenter by at least one of activating, controlling, and deactivating cooling resources of the cooling system in advance to maintain the temperature of the datacenter within the optimum temperature range.

BRIEF DESCRIPTION OF THE SEVERAL VIEWS OF THE DRAWINGS

Exemplary embodiments of the invention are illustrated in the accompanying figures. These embodiments are merely exemplary, i.e., they are not intended to limit the content and scope of the appended claims.

DETAILED DESCRIPTION

Figure 1:
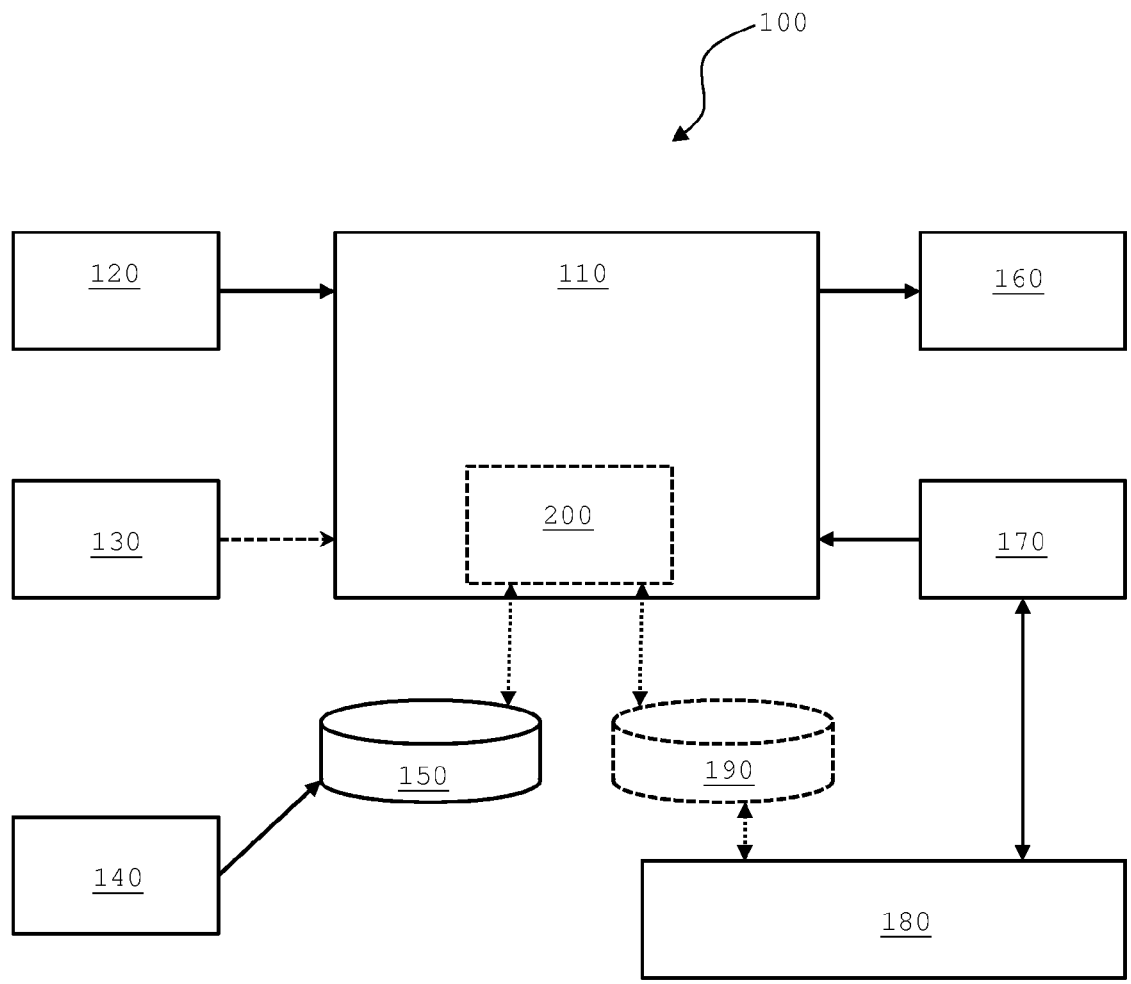
FIG. 1 shows a schematic view of a system according to an embodiment the inventive method.

Referring now to FIG. 1, a system 100 for regulating the temperature of a datacenter within an optimum temperature range by at least one cooling device 160 is shown. The system includes at least a main controller 110, a control interface 120 for entering data by a user, a scheduler application 140, a workload schedule database 150, and a workload based logic 200. The control interface is adapted for inputting by a user a thermal threshold value for a datacenter temperature into the main controller 110. The main controller 110 is adapted to control at least one cooling device 160 of the datacenter based upon the inputted threshold value and a predicted thermal load calculated by workload based logic 200. The workload based logic 200 is adapted to predict a thermal load of the datacenter based upon information in a schedule plan database 150, and the schedule plan database 150 is logically connected to a scheduler application interface 140 that delivers information to the schedule plan database 150 about scheduled jobs to be performed by machines assembled in the datacenter.

Prediction of the thermal load can be performed by calculating which machines of the datacenter are needed to perform a specific job. The thermal load caused by needed the machines can be summated, so that the thermal energy produced within the datacenter can be predicted for each future time period for which the scheduled jobs are known. When taking the thermal inertia, i.e., the thermal behavior, of the datacenter into consideration, the controller 100 can start the cooling devices in due time prior a thermal load is caused by machines performing a job, or the controller can turn off a cooling device prior to the termination of the job. The thermal behavior of the datacenter will tolerate such predicted controlling of the cooling devices. This enables to use the thermal inertia of the datacenter to flatten the thermal develop of the datacenter, thereby avoiding temperature peaks. It furthermore enables to use the cooling resources of the datacenter in a smoother way which reduces the energy consumption of the datacenter caused by the cooling devices.

Furthermore, the system comprises an environmental sensor 170 that delivers data about environmental conditions, like, e.g., humidity and/or temperature within the datacenter to the workload based logic 200. These data can be used to predict the thermal load of the datacenter more precisely since the thermal inertia of the datacenter is influenced by factors like humidity and temperature. These environmental data can be stored in a room properties database 190 which is logically connected to the workload logic 200. The room properties database 190 is adapted to deliver at least information about the room properties of the datacenter relevant for the prediction of the thermal load to the workload logic 200. Additionally, the system shown comprises an environmental interface 180 logically connected to the room properties database 190 for inputting data by a user about the room properties of the datacenter into the room properties database 190. This enables adaptation of the environmental data of the datacenter to new circumstances, like, e.g., changes in the datacenter constructional architecture, which may influence the thermal behavior of the datacenter.

Figure 2:
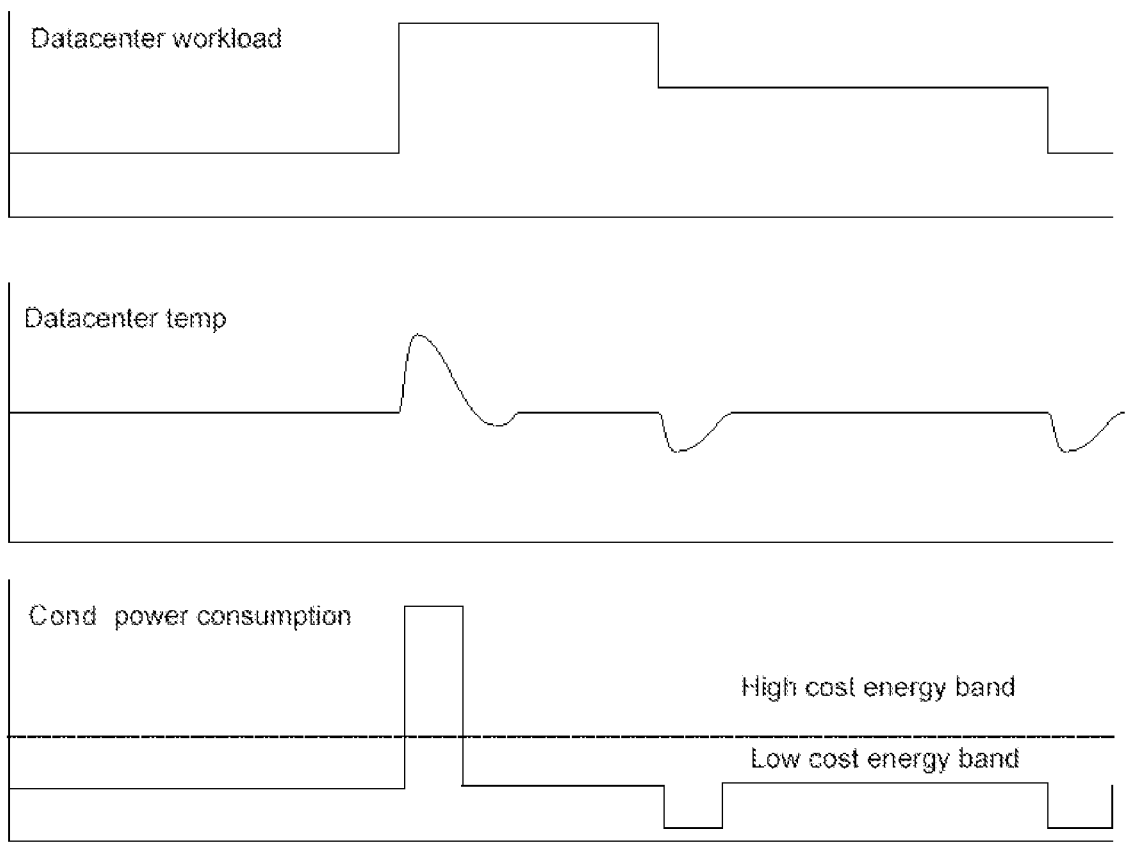
FIG. 2 shows the power consumption and temperature profile for conditioning of a datacenter according to the state of the art.

In FIG. 2, the power consumption and temperature profile for conditioning of a datacenter according to the state of the art is shown. What the prior arts methods do is to react to the workload. The upper graph shows the workload in a datacenter, and as consequence the graph in the middle shows how the temperature is affected, having spikes above the "normal" temperature when the workload increases, and spikes below the "normal" temperature when the workload decreases. The lower graph shows the power consumption for this kind of conditioning, which increases during the above optimal temperature peaks (when the temperature increases and there is the need for a fast cool down), and decreases during the below optimal temperature peaks (when the temperature is below the optimal value and the negative peaks allow for reduction of the power consumption).

Figure 3:
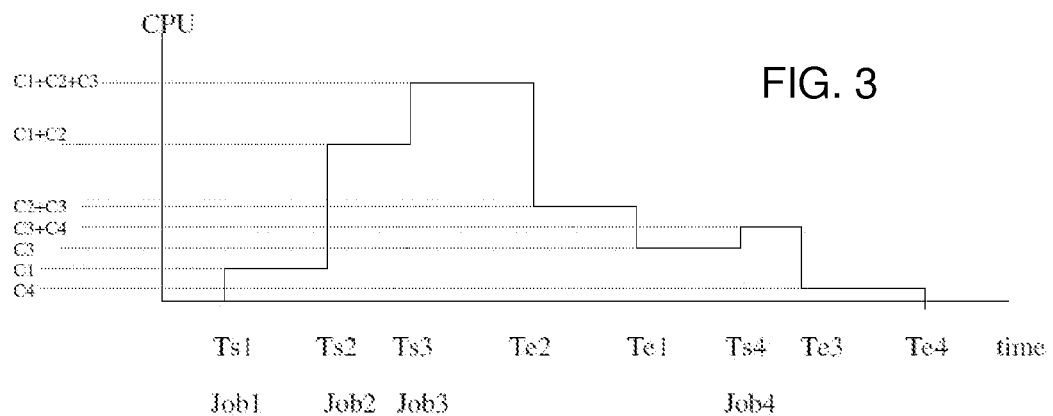
FIG. 3 depicts exemplarily the workload of a datacenter.

FIG. 3 depicts exemplarily the workload of a datacenter. As illustrated in the Workload Scheduler plan the following conditions are known:

JOB1 starts at time Ts1, ends at Te1, and consumes CPU amount C1 (in total);
JOB2 starts at time Ts2, ends at Te2, and consumes CPU amount C2 (in total);
JOB3 starts at time Ts3, ends at Te3, and consumes CPU amount C3 (in total);
JOB4 starts at time Ts4, ends at Te4, and consumes CPU amount C4 (in total).

The workload may be predicted based on the information that is contained in such a plan. By knowing the job characteristics in terms of duration and CPU consumption, and hardware resources utilized to run the job, the thermal load generated by running the job may be predicted.

Figure 4:
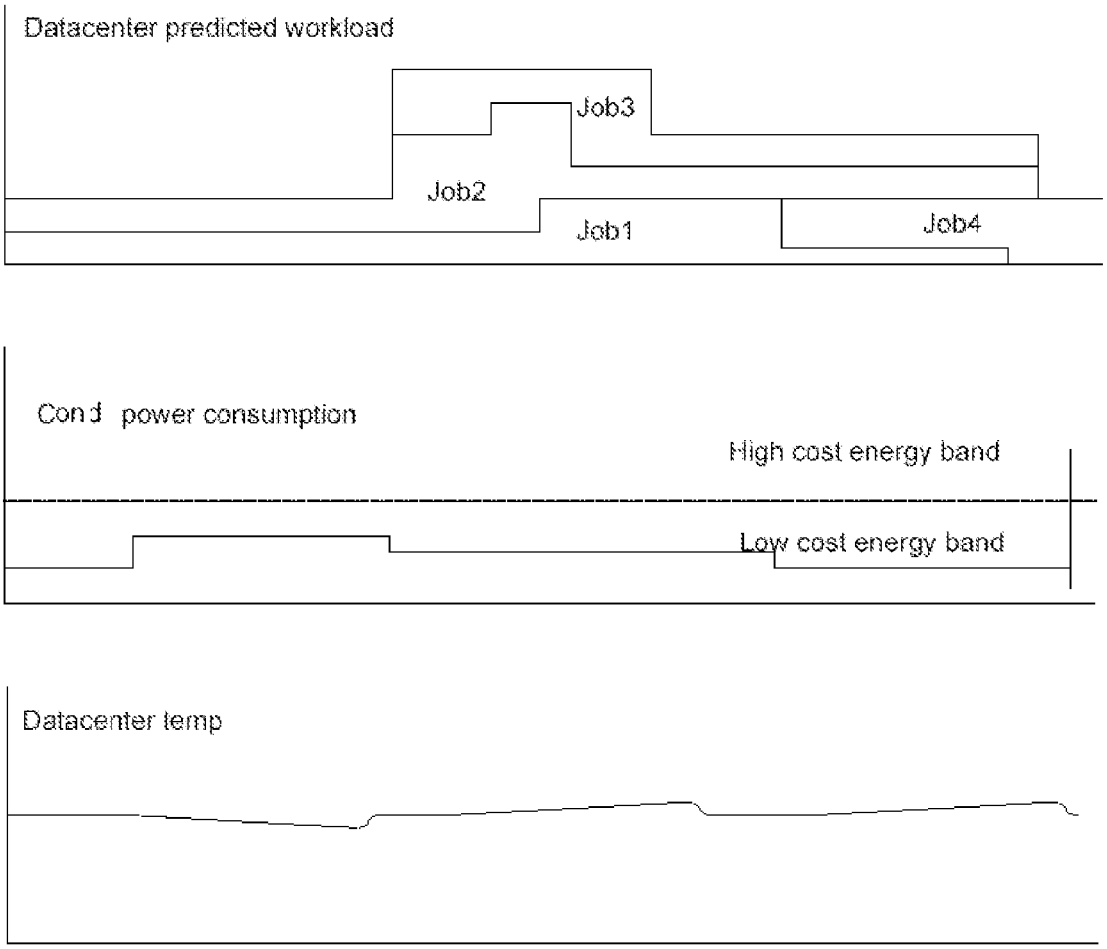
FIG. 4 shows the power consumption and temperature profile for conditioning of a datacenter according to an embodiment of the invention.

In FIG. 4, the power consumption and temperature profile for conditioning of a datacenter according to an embodiment of the invention is shown. The upper graph shows the distribution of the jobs causing the workload. The graph in the middle shows the power consumption to operate a cooling system within the datacenter. There is no sudden requirement to increase/decrease the temperature, thus no peak of temperature and no corresponding peak of power consumption is caused. In order to evaluate the temperature generated by a certain CPU, there are reference tables that can be used by hardware type. Also, measurement can be performed by measuring the heat generation having the machines of the datacenter in idle state and then measuring the heat generated when the machine is running 100% CPU. A fraction of CPU generates a fraction of that heat. Also, the heat generated can be derived based on the power consumed by the CPU evaluating the heat generated by such electrical power, and attributing power consumption to a certain CPU usage. As can be seen, high peaks in temperature and/or power consumption can be avoided by using the invention. The energy consumption can be kept at low levels, thereby making use of a low cost energy band, since energy consumption is in general also charged by the maximum power provided by the energy provider. This gives a significant economic benefit to the inventive method and system.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As will be appreciated from above, a method for reducing the power consumption associated with the cooling of a datacenter is provided, as well as a system for reducing the power consumption associated with the cooling of a datacenter.

In particular, a method for regulating the temperature of a datacenter within an optimum temperature range includes predicting a thermal load from a workload scheduler containing information on machines assembled the datacenter to be turned on and/or off during a particular time period and the thermal load of the datacenter associated with the work of the machines within the particular time period. At least one cooling system of the datacenter is controlled based upon the predicted thermal load within the particular time period under consideration of the thermal inertia of the datacenter by at least one of activating, controlling, or deactivating cooling resources of the cooling system in advance to maintain the temperature of the datacenter within the optimum temperature range.

The workload scheduler works by using plan records stored in storage and in a plurality of data sets, wherein the plan records contain information about jobs to be performed by the datacenter. Each plan record includes at least information on the day, hour, and minute the job represented by the data is scheduled to start, the machines within datacenter needed to perform the job, and the duration of the job. The workload scheduler triggers "temperature sensible" entities of the datacenter in its workload plan, like, e.g., the required activation of a pool of machines.

The knowledge of the planned activity scheduled in the datacenter, i.e., the jobs to be performed within a particular period of time, is used with a scheduling application to properly tune the cooling of the datacenter in accordance with the optimum temperature value. If a set of machines is activated in a specific period of time frame due to the workload planned for that time period, the cooling system is informed by a controlling system that it needs to change the temperature and/or the cooling rate within that period of time, so that the cooling system can start in advance and have the proper temperature in place when additional devices are turned on according to the activity scheduled. The same is true for the shutdown of the machines due to the termination of the workload planned; the cooling can be throttled or shut down in advance before the planned activity has been terminated under exploitation of the thermal inertia of the datacenter and the cooling system while still remaining at the optimal temperature when the workload ends.

By the inventive method embodiments, steep peaks in the temperature profile can be avoided. This reduces significantly the energy consumption of the cooling system. Furthermore, a smooth operation of the cooling system is enabled, i.e., the cooling system has not to be turned on and off to 100% of capacity, but can be controlled in a ramp-like way, thereby avoiding amperage peaks in the power consumption of the cooling system. Since often electric energy consumption has to be paid based upon the maximum amperage peak load to be expected, to avoid such amperage peaks gives an additional economic benefit to the inventive method.

The temperature within the datacenter may additionally be controlled by a thermostat. The thermostat ensures that the temperature within the datacenter does not excite a critical value by turning on cooling resources of the datacenter when an upper threshold is over-run or turning off cooling resources when a lower threshold is under-run. This ensures that the datacenter is kept in working condition with respect to the temperature even when an unpredicted event occurs, like a sudden increase or decrease of the workload and the associated thermal effect to the datacenter, e.g., like caused by a malfunction of a machine in the datacenter.

Therefore, the inventive method embodiments for regulating the temperature of a datacenter, instead of being an alternative to a thermostat, may be considered as an add-on. Most of the time, the inventive method embodiments will prevent the intervention of the thermostats.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

While the invention has been illustrated and described in detail in the drawings and fore-going description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method for regulating the temperature of a datacenter within an optimum temperature range, the method comprising:
predicting, using a computing device, a thermal load from a workload scheduler containing information on machines assembled in the datacenter to be turned on and/or off during a particular time period, and the thermal load of the datacenter associated with the work of the machines within the particular time period; and
controlling at least one cooling system of the datacenter based upon the predicted thermal load within the particular time period under consideration of a thermal inertia of the datacenter by at least one of activating, controlling, and deactivating cooling resources of the cooling system in advance to maintain the temperature of the datacenter within the optimum temperature range.

2. The method according to claim 1, wherein the workload scheduler works by using plan records, each representing a job to be performed by the datacenter, each plan record comprising at least information on the day, hour, and minute the job represented by the data is scheduled to start, the machines within datacenter needed to perform the job, and the duration of the job.

3. The method according to claim 2, wherein the prediction of the thermal load is performed by calculating the thermal load at a particular time period from the information comprised in the plurality of workload scheduler plan records.

4. The method according to claim 1, wherein for predicting a thermal workload, actual environmental information on the datacenter are taken into consideration.

5. The method according to claim 4, wherein at least information about the actual humidity and/or the actual temperature of the datacenter are taken into consideration.

6. A system for regulating the temperature of a datacenter within an optimum temperature range by at least one cooling device, the system comprising:
a main controller;
a control interface that receives data entered by a user;
a scheduler application;
a workload schedule database; and
workload based logic;
wherein the control interface is adapted to receive input, from the user, including a thermal threshold value for a datacenter temperature into a main controller, and wherein the main controller is adapted to control at least one cooling device of the datacenter based upon the inputted threshold value and a predicted thermal load calculated by the workload based logic, the workload based logic adapted to predict a thermal load of the datacenter based upon information in a schedule plan database, the schedule plan database logically connected to a scheduler application interface that delivers information to the schedule plan database about scheduled jobs to be performed by machines assembled in the datacenter.

7. The system according to claim 6, further comprising at least one environmental sensor delivering data about environmental conditions within the datacenter to the workload based logic.

8. The system according to claim 6, further comprising a room properties database logically connected to the workload logic, the room properties database adapted to deliver at least information about the room properties of the datacenter relevant for the prediction of the thermal load to the workload logic.

9. The system according to claim 6, further comprising an environmental interface logically connected to the room properties database, the environmental interface configured to receive data input by a user about the room properties of the datacenter into the room properties database.

10. A non-transitory, computer readable medium having computer readable instructions stored thereon that, when executed by a computer, implemented a method for regulating the temperature of a datacenter within an optimum temperature range, the method comprising:
predicting a thermal load from a workload scheduler containing information on machines assembled in the datacenter to be turned on and/or off during a particular time period, and the thermal load of the datacenter associated with the work of the machines within the particular time period; and
controlling at least one cooling system of the datacenter based upon the predicted thermal load within the particular time period under consideration of the thermal inertia of the datacenter by at least one of activating, controlling, and deactivating cooling resources of the cooling system in advance to maintain the temperature of the datacenter within the optimum temperature range.

11. The computer readable medium according to claim 10, wherein the workload scheduler works by using plan records, each representing a job to be performed by the datacenter, each plan record comprising at least information on the day, hour, and minute the job represented by the data is scheduled to start, the machines within datacenter needed to perform the job, and the duration of the job.

12. The computer readable medium according to claim 11, wherein the prediction of the thermal load is performed by calculating the thermal load at a particular time period from the information comprised in the plurality of workload scheduler plan records.

13. The computer readable medium according to claim 10, wherein for predicting a thermal workload, actual environmental information on the datacenter are taken into consideration.

14. The computer readable medium according to claim 13, wherein at least information about the actual humidity and/or the actual temperature of the datacenter are taken into consideration.

* * * * *